(12) United States Patent
Yap

(10) Patent No.: US 6,246,350 B1
(45) Date of Patent: Jun. 12, 2001

(54) OPTOELECTRONIC ANALOG-TO-DIGITAL CONVERTER

(75) Inventor: Daniel Yap, Thousand Oaks, CA (US)

(73) Assignee: Hughes Electronics Corporation, El Segundo, CA (US)

(*) Notice: Subject to any disclaimer, the term of this patent is extended or adjusted under 35 U.S.C. 154(b) by 0 days.

(21) Appl. No.: 09/222,611

(22) Filed: Dec. 23, 1998

(51) Int. Cl.[7] ................................................ H03M 1/00
(52) U.S. Cl. ................................................ 341/137; 324/96
(58) Field of Search ........................... 341/137, 13, 14; 324/244.1, 96; 350/96.13; 385/4

(56) References Cited

U.S. PATENT DOCUMENTS

| | | | |
|---|---|---|---|
| 5,010,346 | * 4/1991 | Hamilton et al. | 341/137 |
| 5,253,309 | * 10/1993 | Nazarathy et al. | 385/4 |
| 5,955,875 | * 9/1999 | Twichell et al. | 324/96 |

* cited by examiner

Primary Examiner—Brian Young
Assistant Examiner—John Nguyen
(74) Attorney, Agent, or Firm—Terje Gudmestad

(57) ABSTRACT

An analog to digital converter has an optical pulse source generating an optical pulse chain having a plurality of optical pulses. An optoelectronic digitizer has a first input receiving the optical pulse chain. The digitizer has a second input for receiving the analog signal to be converted. The digitizer has a plurality of digital outputs. Each of the digital outputs corresponds to a range value. An electronic encoder receives the plurality of digital outputs. The encoder has an output in a predetermined digital format.

18 Claims, 4 Drawing Sheets

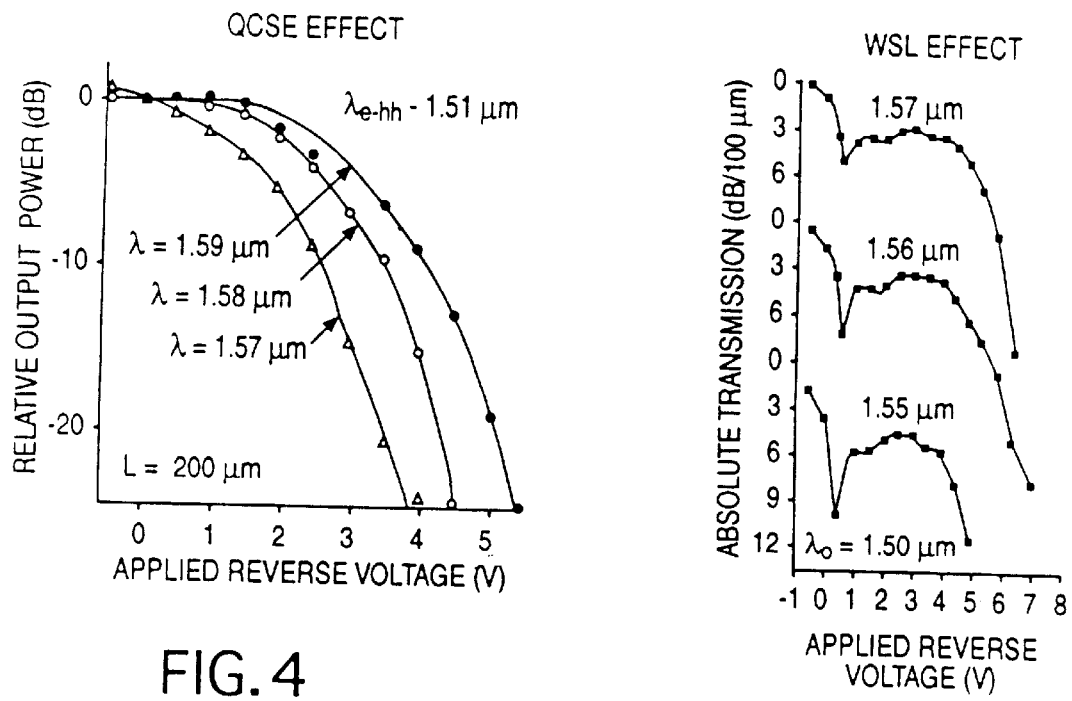
FIG. 4
FIG. 5
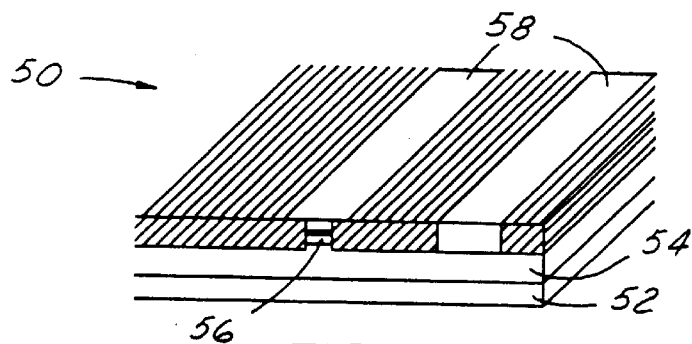
FIG. 6
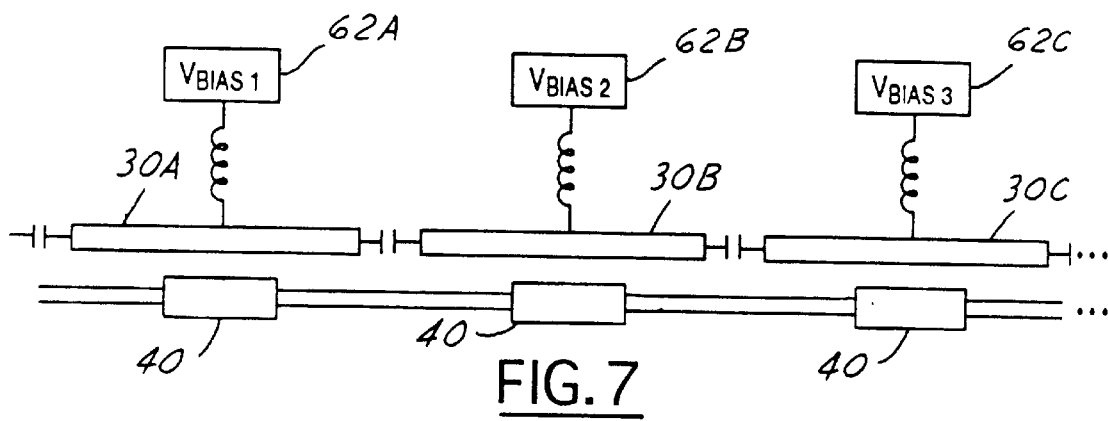
FIG. 7

OPTOELECTRONIC ANALOG-TO-DIGITAL CONVERTER

RELATED APPLICATION

The present invention is related to co-pending commonly assigned simultaneously filed application entitled "Multi-function Optoelectronic Device Structure" and is hereby incorporated herein by reference.

TECHNICAL FIELD

The present invention relates generally to analog-to-digital converters. More specifically, the present invention relates to an optoelectronic analog-to-digital converter.

BACKGROUND ART

Analog-to-digital converters are used in many applications. Known analog-to-digital converters, however, have been limited by their sampling rate. Presently, the fastest known analog-to-digital converters have sampling rates below 10Gigasamples per second (GsPs). Most analog-to-digital converters have a sampling rate below one GsPs.

Another limitation of presently known converters is that aperture jitter is typically about one psec. Aperture jitter is the amount by which the sampling window may vary. Aperture jitter lowers the sampling rate capability of the analog-to-digital converter.

Optoelectronic analog-to-digital converters are known that use the electrooptic effect in Mach-Zehnder interferometers. In these previous optoelectronic A/D converters, a plurality of waveguide Mach-Zehnder interferometers are arranged in parallel. An optical pulse input is divided in power and fed to all of the interferometers. The electrical analog input is also divided in power and fed to all of the interferometers. Each interferometer contains an electrode of different lengths, with the lengths chosen to produce a high-light "1" or a low-light "0" output from that interferometer according to the level of the analog input. The previous analog-to-digital converters have been realized using titanium-diffused lithium-niobate waveguide structures. The resolution of such converters has been limited by the small electrooptic coefficient of lithium-niobate. In such devices, the length for interaction between the analog input signal and the optical pulse is very long. Because of this, the device has a length of six centimeters. This is a very long package with respect to microelectronic applications. Another characteristic of such devices is that very high voltages must be used to power the devices. One known device, for example, uses a peak-to-peak voltage of 16.8 volts. The device has only a four bit accuracy. When based on Mach-Zehnder interferometers, the smallest voltage increment that may be sensed by the A/D converter is two volts. This is due to the limited substrate size that is presently available.

If the converter must be sensitive to low input voltages, the electrodes must be very long. Because of the length, the capacitances of these electrodes limit the electrical frequency response of the interferometers. Consequently, the maximum speed of the analog-to-digital converter is reduced.

SUMMARY OF THE INVENTION

It is, therefore, one object of the invention to provide an analog-to-digital converter capable of a higher rate of sampling than that previously known. A further object of the invention is to provide an analog-to-digital converter having a reduced package size and lower energization voltage level.

In one aspect of the invention, an analog-to-digital converter has an optical pulse source generating an optical signal having a plurality of optical pulses. An optoelectronic digitizer has a first input receiving the optical pulse chain. The digitizer has a second input for receiving the analog signal to be converted. The digitizer has a plurality of digital outputs. Each of the digital outputs corresponds to a range value. An electronic encoder receives the plurality of digital outputs. The encoder has an output in a predetermined digital format.

In a further aspect of the invention, the optoelectronic digitizer has a plurality of electrically controlled optical absorbers. The digitizer further has a traveling wave electrode coupled to the analog signal. As the optical pulses travel toward the photodetectors, the analog signal changes the absorption of the optical absorbers. The photodetectors provide an indication of the range values corresponding to the portion of the analog-to-digital signal that corresponds to the optical absorbers. The photodetectors provide an indication as to whether the voltage is above or below a given discrete value.

One advantage of the invention is that lower voltages may be used to activate the device. A further advantage of the invention is that the voltage dependent absorbers of the present invention can all be located on the same chip. This reduces the size of the analog-to-digital converter implementation.

A further advantage of the invention is that the direct digitization of wave forms such as L, X, Ku-band radar, EW signals, SHF SATCOM signals and DIRECT TV signals is possible due to high sampling rates and low aperture jitter.

Other objects and features of the present invention will become apparent when viewed in light of the detailed description of the preferred embodiment when taken in conjunction with the attached drawings and appended claims.

BRIEF DESCRIPTION OF THE DRAWINGS

FIG. 4 is a plot of relative output power of an optical absorber according to the present invention.

FIG. 5 is a plot of absolute transmission versus applied reverse voltage at various wavelengths.

FIG. 6 is an epitaxial layer representation of the analog-to-digital converter.

FIG. 7 is an alternative embodiment of a traveling wave electrode.

BEST MODE(S) FOR CARRYING OUT THE INVENTION

Figure 1:
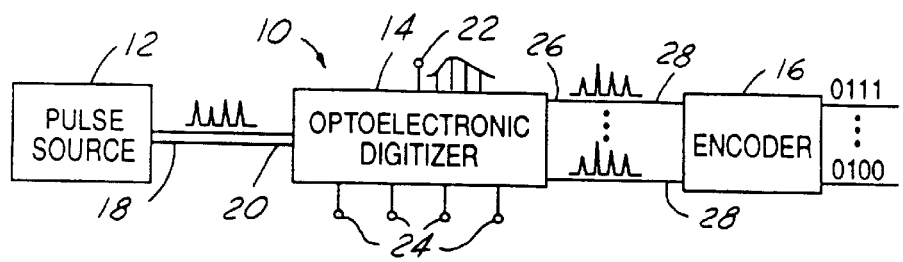
FIG. 1 is a high level block diagram of an analog-to-digital converter according to the present invention.

Referring now to the drawings, the same reference numerals are used to identify the same components in the various views. Although the invention is described and illustrated in terms of an analog-to-digital converter that may use the same epitaxial layers of the substrate to form the various components of the analog-to-digital converter. The various components of the analog-to-digital converter may also be formed of coupled-together discrete components.

Referring now to FIG. 1, an analog-to-digital converter 10 is illustrated having a pulse source 12, an optoelectronic digitizer 14, and an encoder 16. Pulse source 12 has a pulse output 18 coupled to a pulse input 20 of optoelectronic digitizer 14.

Pulse source 12 is preferably a mode-locked laser that has low timing and amplitude jitter. Various types of mode-locked lasers are known in the art that have suitable characteristics. Suitable lasers are semiconductor or optical-fiber lasers. Preferably, pulse source 12 has a timing jitter of less than 0.05 psec. and a pulse width of less than 1.0 psec. The pulse width and timing jitter determine the resolution and bandwidth of the A/D conversion as known in the art.

Optoelectronic digitizer 14 has an analog input 22 and a plurality of bias voltage inputs 24. Optoelectronic digitizer 14 has a plurality of outputs 26. Each output 26 of digitizer 22 is coupled to an input 28 of encoder 16. Encoder 16 converts the output of digitizer 14 into a binary number or Gray code.

Generally, the operation of analog-to-digital converter 10 is as follows: Pulse source 12 provides a plurality of precisely timed short optical pulses to digitizer 14. Each of the optical pulses corresponds to and samples a specific point of the analog waveform to be converted. The optical pulse intensities are attenuated in digitizer 14 as controlled by analog input 22. The current or voltage at each output 26 can be interpreted as representing a logic 1 or 0 according to whether the level of the sampled analog signal exceeds or is less than the discrete value associated with that output. Encoder 16 converts the output of digitizer into a code that represents the digital value of the sampled analog wave form.

Figure 2:
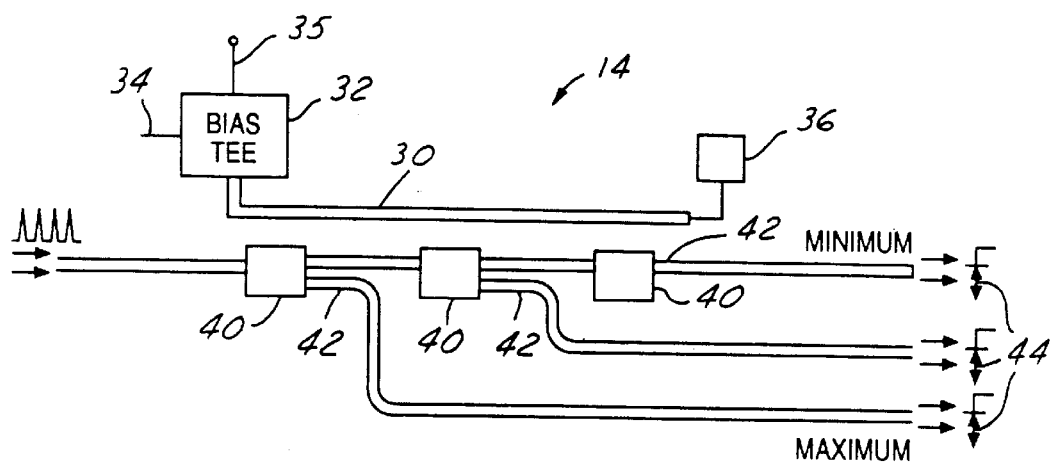
FIG. 2 is a block diagram of an optoelectronic digitizer according to the present invention.

Referring now to FIG. 2, a first embodiment of optoelectronic digitizer 14 is illustrated. Optoelectronic digitizer 14 has a traveling wave electrode 30. Traveling wave electrode 30 has a bias tee 32 which has an input 34 for receiving the analog waveform to be sampled or converted to a digital signal. Bias tee 32 also has a bias voltage input 35 coupled to a voltage source. Traveling wave electrode 30 also has a termination 36 that dissipates the analog waveform traveling through traveling wave electrode 30 and prevents the analog signal from interfering with itself.

Optoelectronic digitizer 14 receives the pulses from pulse source 12 (illustrated in FIG. 1) through an optical waveguide 38. A plurality of optical absorbers 40 is coupled to optical waveguide 38. In this embodiment, optical absorbers 40 are coupled in series. Each optical absorber 40 has an output tap 42. Each tap 42 is optically coupled to a photodetector 44. Photodetectors 44 convert the intensity of the light signal in taps 42 into a current or voltage value corresponding to the intensity level. The number of taps 42 and photodetectors 44 relate to the bit length accuracy of optical absorber 40.

In operation, traveling wave electrode 30 receives and carries the analog waveform to be sampled. Each optical absorber 40 is associated with a portion of the traveling wave electrode 30. Only three optical absorbers 40 are illustrated. However, a greater or lesser number of optical absorbers may be included. The instantaneous amount of absorption caused by each optical absorber 40 depends on the voltage level present on the portion of the traveling wave electrode 30 associated with that absorber. This corresponds to the analog signal coincident at that absorber. Of course, other variables may effect the amount of absorption such as the length of the absorber, the level of DC bias voltage at input 35, the wavelength of the optical pulse, and the material composition of the absorber. Thus, the intensities of the optical pulses coupled to optical waveguide 38 are changed according to the voltage levels in optical absorbers 40. Each optical absorber 40 is designed to achieve a specific amount of optical absorption (reduction in impulse intensity) for a specific voltage level of the analog waveform. In this manner, an optical impulse samples the analog waveform by having its intensity attenuation changed according to the voltage value of that waveform at the instance the analog waveform, carried by the traveling wave electrode, coincides with the arrival of the optical impulse in the associated absorber. Photodetectors 44 produce an electrical representation (in the form of an electrical charge) of the intensities of the attenuated optical impulses.

Traveling wave electrode 30, optical absorbers 40, and optical waveguide 38 are designed to achieve matching of the velocities of the electrical waveform and the optical pulses. This allows a given optical pulse to sample the same point on the analog waveform as they both propagate through the digitizer 14.

Figure 3:
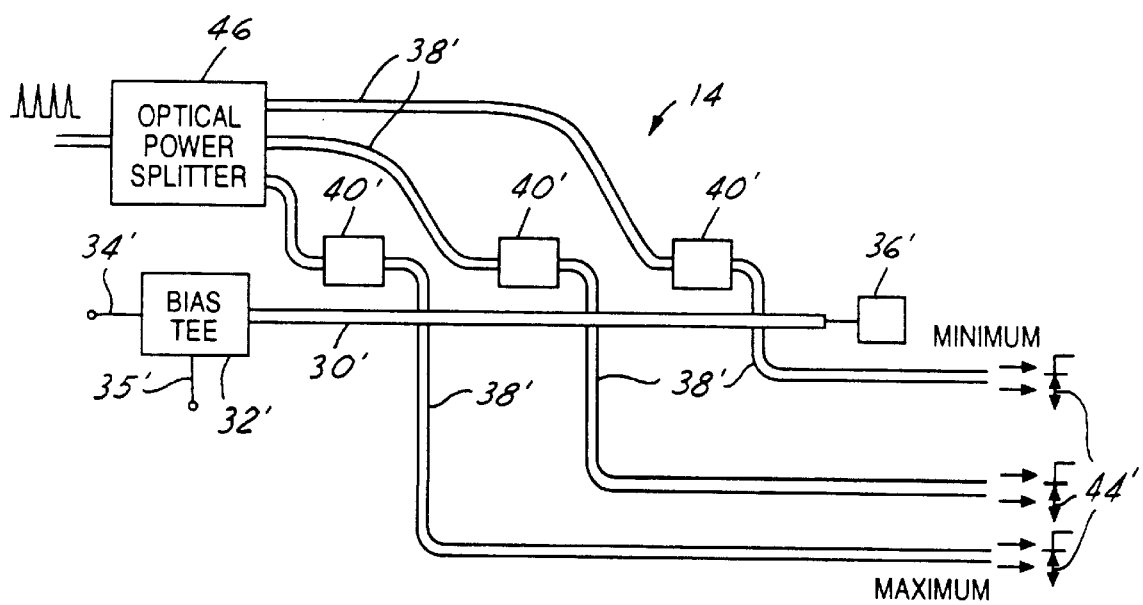
FIG. 3 is a first alternative embodiment of an optoelectronic digitizer according to the present invention.

Referring now to FIG. 3, a second embodiment of an optoelectronic digitizer 14' is shown. Optoelectronic digitizer 14' has traveling wave electrode 30' having a bias tee 32' with an analog input 34' and a bias voltage input 35'. Traveling wave electrode 30' is coupled to a termination 36'. The operation of traveling wave electrode 30' is similar to that described with respect to FIG. 2. The functional difference between FIG. 2 and FIG. 3 is that optical absorbers 40' are positioned in parallel rather than in series.

A plurality of optical absorbers 40' are coupled to an optical splitter 46. Optical pulses from optical splitter 46 are coupled into optical waveguides 38'. Optical splitter 46 divides the optical pulses and thus the power of the pulses into the parallel paths of the optical waveguides 38'. Thus, the optical absorption sensed by each photodetector 44' is produced separately by its associated absorber 40' rather than resulting from an accumulation of the absorption undergone in all segments preceding and including the associated optical absorber 40'.

Each optical absorber 40' is coupled to splitter 46 by parallel waveguides 38'. Each optical absorber 40' also is associated with a portion of the traveling wave electrode 30' (prime).

Thus, as the voltage level of the input analog waveform 34 at input 34' varies, the optical absorption of each optical absorber 40' varies in a similar manner to that shown in FIG. 2.

Two preferred mechanisms for electroabsorption are the Quantum-Confined Stark Effect (QCSE) in quantum-well structures and Wannier-Stark Localization (WSL) in superlattices. Both of these well-known effects enhance the optical absorption as a function of the applied electrical potential.

Electroabsorption characteristics achieved by the QCSE are shown in FIG. 4. The optical output is plotted as a function of the applied voltage. An optical absorption of 20 dB for an absorber length of 200 $\mu$m is achieved with a voltage change of four to five volts. The particular electroabsorption dependence is also affected by the optical wavelength and design of the Quantum-Well structure. For a typical QCSE absorber with a detuning of 80 nanometers between the optical wavelength and the wavelength of the first electron-to-heavy hole transition, the absorption strength is four dB for 200 μm length. Consider, for example, an analog input with a maximum voltage of 3.0 volts. If a 4 dB change in absorption is needed to sense each discrete level of the analog input, the first absorber would have a length of 200 μm. For a six bit linear A-to-D converter, the second optical tap would correspond to an input voltage of 2.95 volts. An absorption of four dB at this voltage can be achieved with an additional absorber length of 3.3 μm. The length of that second absorber segment is thus 3.3 μm. Accuracies in length better than 0.1 μm are achieved routinely by using conventional photolithographic fabrication techniques. The above examples are described with respect to a series-type digitizer as is illustrated in FIG. 2.

Referring now to FIG. 5, WSL effect is described with respect to a digitizer having parallel optical absorbers such as that shown in FIG. 3. The traveling wave electrode 30 for this example has a DC-bias voltage of −0.6 volts. This results in high absorption as is shown by the local minimum shown in FIG. 5. In this example, the lower plot corresponds to the first optical absorber 40. For a maximum input waveform voltage of 1.0 volts, the net voltage applied to the first absorber changes from −0.6 to +0.4 volts. This corresponds to a change in absorption of two dB per 100 μm length. If an overall change in absorption of three dB is desired, the first absorber segment would therefore be 150 μm long. Small voltages will produce a greater amount of absorption than three dB. If a six bit linear resolution is desired, the smallest voltage sensed is 0.0156 volts. If the absorber segment which senses this smallest voltage change has an electroabsorbtion characteristic represented by the upper curve of FIG. 5, a waveform voltage of 0.0156 volts produces an absorption of five dB per 100 μm length. Thus, a 60 μm long absorber segment would be appropriate for this voltage level and absorber structure.

Referring now to FIG. 6, an epitaxial layer structure 50 is illustrated. Epitaxial layer structure 50 has a substrate 52, a subcollector layer 54, an electro-optic absorbing region 56, a spacer layer 57 and a traveling wave electrode 58. The particular electrode configuration shown is illustrative, not preferred. Preferably, all of the components of FIG. 1 but the optical pulse source 12 may be fabricated using common epitaxial layers. One example of a method of forming epitaxial layer structure 50 is described in copending commonly filed application entitled "Multi-Function Optoelectronic Device Structure" and is incorporated by reference herein. The optical pulses provided by pulse source 12 enter electrooptic absorbing layer 56. By energizing and deenergizing traveling wave electrode 58, the amount of optical energy traveling through electrooptic absorbing layer is reduced in accordance with the applied voltage according to FIGS. 4 and 5.

Referring now to FIG. 7, an alternative to a single traveling wave electrode 30 as shown in FIGS. 2 and 3 is illustrated. This embodiment allows separate voltage control of the various voltage segments. Traveling wave electrodes 30' may consist of a plurality of segments 30'A, 30'B, and 30'C. Each electrode segment, 30A, 30B, and 30C may be coupled to a separately controlled bias voltage source 62A, 62B, and 62C respectively. Adjacent electrode segments are AC coupled together. The analog waveform to be sampled propagates through traveling wave electrode segments, 30'A, 30'B, and 30'C., in succession. This configuration allows control of the individual bias voltages of the individual traveling wave electrode segments 30'A, 30'B, and 30'C.

By having the capability of controlling the bias voltage of each traveling wave electrode segment individually, the desired amount of electroabsorption can be changed without changing the structure of the absorber. In terms of FIGS. 4 and 5, the same electroabsorption curve may be used at a different applied reverse voltage.

Each traveling wave electrode segment 30'A, 30'B and 30'C. has an associated optical absorber 40 associated therewith. Although three traveling wave electrode segments are illustrated, various numbers of traveling wave electrodes segments may be used.

Figure 8:
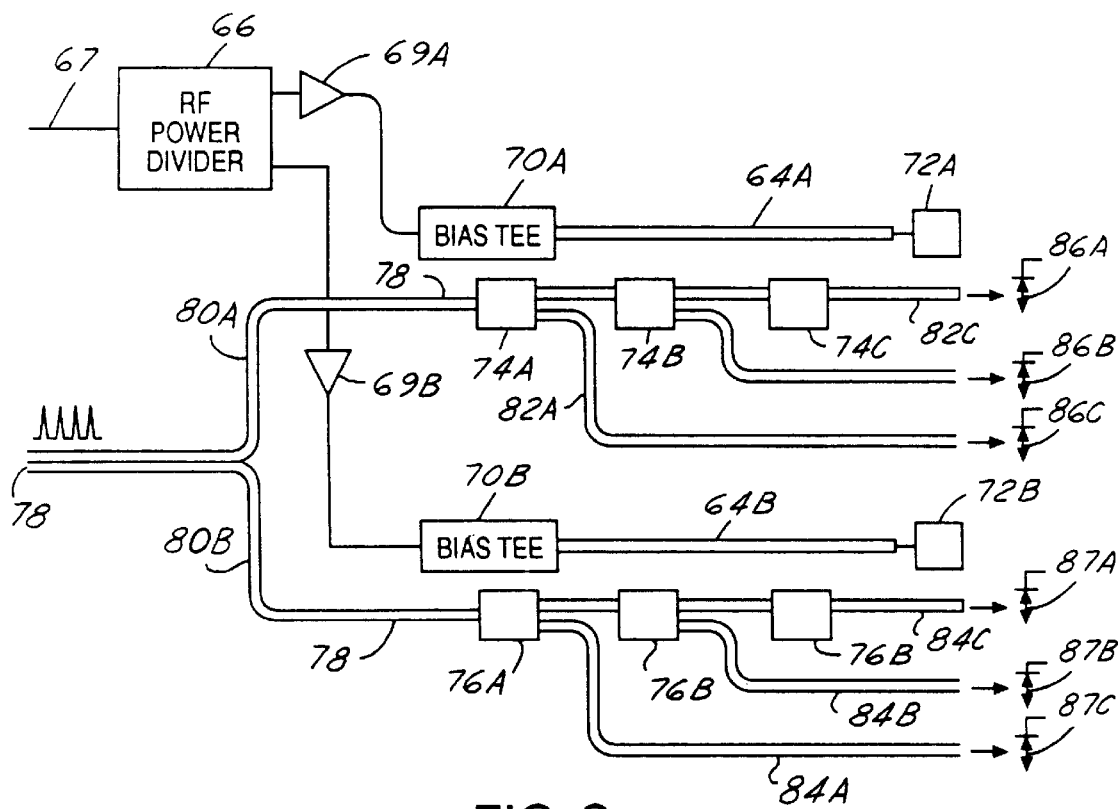
FIG. 8 is an alternative configuration for a traveling wave electrode and absorber segments.

Referring now to FIG. 8, another variation of traveling wave electrode 30 as shown in FIGS. 2 and 3 is illustrated. This embodiment essentially divides the optical signal and the optical absorbers into two portions. The traveling wave electrode may have a first traveling wave electrode 64A and a second traveling wave electrode 64B. An RF power divider 66 receives the analog waveform to be sampled at analog input 67. Power divider 66 is coupled to first traveling wave electrode 64A and second traveling wave electrode 64B through outputs 68A and 68B respectively. Each traveling wave electrode 64A and 64B has an amplifier 69A and 69B, a bias tee 70A and 70B as well as a termination 72A and a 72B. Amplifiers 69A and 69B amplify the analog signal to a desired level. Amplifier 69A and 69B may not be required depending on the amplitude of the analog waveform to input 67. Bias tees 70A and 70B provide DC biasing to traveling wave electrodes 64A and 64B respectively. Terminations 72A and 72B terminate the analog waveform within traveling wave electrodes 64A and 64B.

The variation as illustrated in FIG. 8 has fabrication and layout advantages. Because fewer absorber segments are in each chain, for a fixed length chip, the absorber segments could therefore be longer. Alternatively, there is more space available between successive absorber segments for other features such as waveguide loops and taps. Another advantage of the configuration is that each traveling wave electrode 64A and 64B can be set to different DC bias voltages.

Power divider outputs 68A and 68B should be designed so that the multiple analog waveforms are in proper phase relation when they reach the traveling wave electrode 64A and 64B.

Traveling wave electrode 64A has associated with it a plurality of optical absorbers 74A, 74B and 74C. Traveling wave electrode 64B has optical absorbers 76A, 76B and 76C associated therewith. Optical input 78 receives optical pulses from a pulse source such as those shown in FIGS. 2 and 3. Optical input 78 is coupled to optical waveguides 80A and 80B. Waveguides 80A and 80B direct optical pulses to optical absorbers 74A, 74B, 74C and optical absorbers 76A, 76B and 76C respectively. The lengths of waveguides 80A and 80B are set so that the optical pulse arrives at absorbers 74 and 76 coincident with the portion of the analog waveform to be sampled at electrodes 64A and 64B. Optical absorbers 74A, 74B and 74C have taps 82A, 82B and 82C. Optical absorber 76A, 76B and 76C have optical taps 84A, 84B and 84C. Taps 82 and 84 are the outputs of optical absorbers 74 and 76. Each tap, 82A through 82C are directed to a photodetector 86A, 86B and 86C respectively. Each tap 84A, 84B and 84C are directed to a photodetector 87A, 87B and 87C respectively.

Of course, this embodiment is shown with two sets of these optical absorbers for each of the two traveling wave electrodes. One skilled in the art would recognize various numbers of traveling wave electrodes having various numbers of associated optical absorbers may be used.

A further variation of the above permits time multiplexing of the optical pulses into input 78. For time multiplexing, the different optical pulses are directed to different absorber chains. Thus, the frequency of the pulses propagating at any chain is lower. Time multiplexing allows the use of photodetectors and encoder circuits that have lower frequency response than the sampling frequency.

Figure 9:
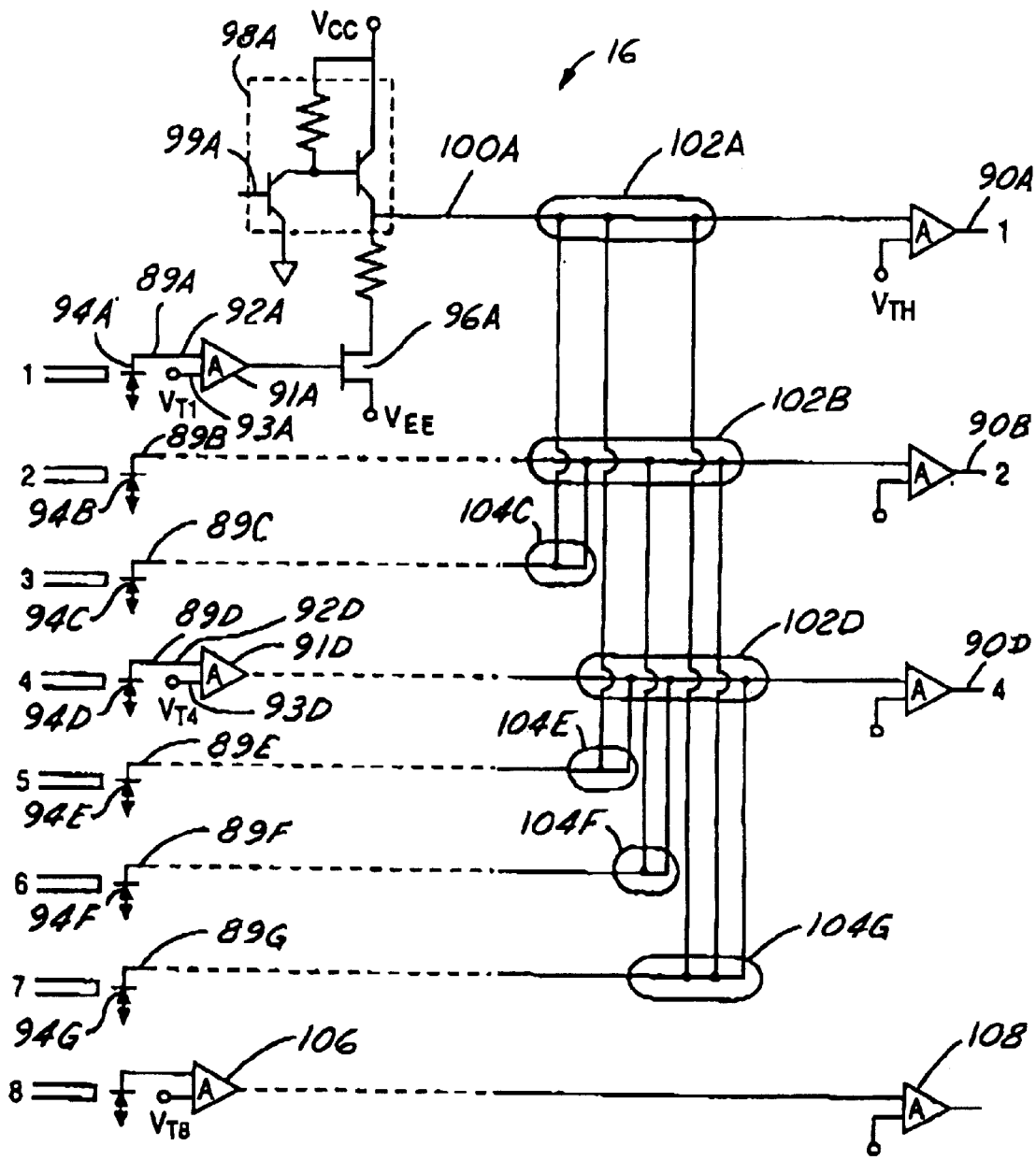
FIG. 9 is a block diagram of an encoder circuit according to the present invention.

Referring now to FIG. 9, encoder circuit 16 is shown in greater detail. Encoder circuit 16 has seven input lines 89A through 89G. Encoder 16 as illustrated produces a three-bit binary-coded output through limiting amplifiers 90A, 90B and 90D. Of course, other numbers of bits of outputs may be formed. Each input 89A through 89G has an amplifier 91A through 91G associated therewith. For simplicity, only amplifiers 91A and 91D are illustrated. The amplifiers 91 have two inputs; 92 and 93. Inputs 92 are coupled to a photodetector 94 associated with the inputs. Inputs 93 are coupled to a threshold voltage. The outputs of amplifier 91 are dependent on the relationship between the photodetector inputs 92 and the threshold level inputs 93. Amplifiers 91 control the operation of RF switches 96. RF switches 96 may, for example, be Field Effect Transistors (FET). In this example, if the output of amplifier 91A corresponds to a logic level 1, RF switch 96A is closed. RF switches 96 are coupled to selectors 98. Selectors 98 are coupled to voltage Vcc and clock inputs 99. Selectors 98 may be formed, for example, from pairs of bipolar transistors. Selectors 98 have outputs 100 coupled to RF combiners 102 or RF dividers 104. A total of three RF combiners 102A, 102B, 102D are used in the circuit. Four RF dividers 104C, 104G, 104F, 104G are used in the circuit. The outputs of the selectors 98 are divided at dividers 104 and combined at combiners 102 to obtain any specific code. For the encoder circuit 16 shown, the output of combiner 102A is connected to limiting amplifier 90A. The output of selector 98C (not shown) is divided at divider 104C and connected through combiner 102A and 102B to limiting amplifiers 90A and 90B. The other connections for the various other outputs 89A through 89G are coupled similarly.

The operation of encoder circuit 16 is illustrated by considering the path through amplifier 91A and combiner 102A as follows: Clock input 99A of selector 98A is synchronized with the time clock of the mode-locked laser pulses used at pulse source 12 as illustrated in FIGS. 2 and 3. The selector amplifies and passes the clock waveform to combiner 102 only when the output of amplifier 91A corresponds to a logic level one. Combiners 102A perform a logical OR operation and passes a voltage value to limiting amplifier 90A that is above a threshold voltage VTH if a clock waveform is passed through selectors 98A or 98E (not shown) or 98G (not shown). Encoder circuit 16 outputs a 3-bit binary number. The least significant bit is output from limiting amplifier 90A and the most significant bit is output from limiting amplifier 90D. Those familiar with the art will recognize that the binary numbers 0 through 7 can be produced by the routing shown in FIG. 9 through dividers 102 and combiners 104.

A pair of thresholding amplifiers 106 and 108 may be used to obtain a threshold voltage which may be included as an output of encoder circuit 16.

Encoder circuit 16 can be constructed from Indium-Phosphide or Galium-Arsenide based materials. This allows the optoelectronic encoder to be formed and monolithically integrated.

When fabricating an analog-to-digital converter, various combinations of the devices may be fabricated monolithically. For example, the optical absorbers and traveling wave electrodes may be monolithically integrated.

While the best mode for carrying out the present invention has been described in detail, those familiar with the art to which this invention relates will recognize various alternative designs and embodiments for practicing the invention as defined by the following claims:

1. An optoelectronic digitizer comprising:
   a optical sampling input for receiving an optical signal;
   a traveling wave electrode for carrying an analog signal thereon, said traveling wave electrode having a termination coupled thereto;
   a plurality of optical absorbers positioned in a relative position adjacent to said traveling wave electrode and a relative coincident portion of said analog signal, each of said optical absorbers altering the optical signal in response to the coincident portion of the analog signal and the relative position of said optical absorber to form a plurality of altered optical signals; and
   a plurality of photodiodes respectively coupled to said plurality of optical absorbers, said plurality of photodiodes receiving said plurality of altered optical signals and substantially simultaneously generating a plurality of digital electrical output signals corresponding to an intensity of said plurality of said altered optical signals.

2. An optoelectronic digitizer as recited in claim 1 further comprising an optical power splitter, said optical splitter coupling said optical absorber in parallel.

3. An optoelectronic digitizer as recited in claim 1 further comprising a first bias source coupled to said traveling wave electrode.

4. An optoelectronic digitizer as recited in claim 1 further comprising a plurality of traveling wave electrodes and a plurality of bias sources each of said plurality of bias sources coupled to a respective traveling wave electrode.

5. An optoelectronic digitizer as recited in claim 1 further comprising a pair of traveling wave electrodes, each of said plurality of traveling wave electrodes having a plurality of optical absorbers associated therewith and further comprising a power divider dividing said analog signal into each of said traveling wave electrodes.

6. An optoelectronic digitizer as recited in claim 1 further comprising an electronic encoder receiving said plurality of digital outputs, said encoder having an output in a predetermined digital format.

7. An optoelectronic digitizer as recited in claim 1 further comprising an optical signal source for generating said optical signal.

8. An analog-to-digital converter for converting an analog signal to a digital signal comprising:
   an optical pulse source generating a optical pulse chain having a plurality of optical pulses;
   an optoelectronic digitizer having a first input receiving said optical pulses, said optoelectronic digitizer having a second input for receiving the analog signal, said optoelectronic digitizer having a third input for receiving a bias voltage, a traveling wave electrode for carrying an analog signal thereon; a plurality of optical absorbers positioned in a relative position adjacent to said traveling wave electrode and a relative coincident portion of said analog signal, each of said optical absorbers altering the optical signal in response to the coincident portion of the analog signal and the relative position of said optical absorber to form a plurality of altered optical signals; and a plurality of photodiodes respectively coupled to said plurality of optical absorbers, said plurality of photodiodes receiving said plurality of altered optical signals and substantially simultaneously generating a plurality of digital electrical output signals corresponding to an intensity of said plurality of said altered optical signals, said optoelectronic digitizer having a plurality of digital outputs, each of said plurality of digital outputs corresponding to a range value; and an electronic encoder receiving said plurality of digital outputs, said encoder having an output in a predetermined digital format.

9. An analog-to-digital converter as recited in claim 8 wherein said optoelectronic digitizer having a third input for receiving a bias voltage.

10. An analog-to-digital converter as recited in claim 8 wherein said pulse source is precisely timed.

11. An analog-to-digital converter as recited in claim 8 wherein said optical pulse source generator is a mode-locked laser.

12. An analog-to-digital converter as recited in claim 8 wherein said optoelectronic digitizer comprises electrically controlled optical absorbers.

13. An analog-to-digital converter as recited in claim 8 wherein said optical absorbers are coupled in-series.

14. An analog-to-digital converter as recited in claim 8 wherein said optical absorbers are coupled in parallel.

15. A method for converting an analog signal to digital signal comprising the steps of:

coupling an optical signal to an electrically controlled optical absorber;

coupling an analog signal to the optical absorber, the analog signal affecting the absorption of a portion of the optical signal to simultaneously obtain a plurality of resultant optical signals corresponding to the magnitude of the analog signal;

converting the plurality of resultant optical signal to a digital signal.

16. A method as recited in claim 15 further comprising the steps of splitting the optical signal into a plurality of optical signals; providing a plurality of electrical absorbers corresponding to the plurality of optical signals.

17. A method as recited in claim 15 further comprising the step of converting the output of the optical detector to a binary-coded output.

18. A method as recited in claim 15 further comprising the steps of encoding the digital signal to obtain a coded digital signal corresponding to the analog signal.

\* \* \* \* \*